United States Patent
Lin et al.

(10) Patent No.: US 8,547,115 B2
(45) Date of Patent: Oct. 1, 2013

(54) TOUCH SENSING SYSTEM, CAPACITANCE SENSING CIRCUIT, AND CAPACITANCE SENSING METHOD

(75) Inventors: Ching-Chun Lin, Taipei County (TW); Wing-Kai Tang, Hsinchu (TW); Ching-Ho Hung, Hsinchu (TW); Tsen-Wei Chang, Taichung County (TW); Yi-Liang Lin, Hsinchu County (TW); Jiun-Jie Tsai, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 369 days.

(21) Appl. No.: 12/983,331

(22) Filed: Jan. 3, 2011

(65) Prior Publication Data
US 2011/0187390 A1    Aug. 4, 2011

(30) Foreign Application Priority Data
Feb. 4, 2010  (TW) ............................... 99103359 A (51) Int. Cl.
*G01R 27/26* (2006.01)
(52) U.S. Cl.
USPC ............ 324/679; 324/686; 382/178; 345/173
(58) Field of Classification Search
USPC .......... 324/658–686, 157; 382/178; 345/173
See application file for complete search history.

(56) References Cited

U.S. PATENT DOCUMENTS

| 5,594,353 A | 1/1997 | Hemphill |
| 5,770,802 A | 6/1998 | Berthold et al. |
| 2008/0042641 A1* | 2/2008 | Stockman ..................... 324/157 |

FOREIGN PATENT DOCUMENTS

| CN | 101027627 | 8/2007 |
| CN | 201382977 | 1/2010 |
| TW | 200644422 | 12/2006 |
| TW | 200917130 | 4/2009 |

OTHER PUBLICATIONS

"Office Action of China Counterpart Application", issued on Sep. 24, 2012, p. 1-p. 5.
"Office Action of Taiwan Counterpart Application", issued on Jul. 8, 2013, p. 1-p. 3, in which the listed references were cited.

* cited by examiner

*Primary Examiner* — Vincent Q Nguyen
(74) *Attorney, Agent, or Firm* — Jianq Chyun IP Office (57) ABSTRACT

A touch sensing system including a touch input interface and a capacitance sensing circuit is provided. The touch input interface includes a plurality of sensing capacitors for outputting a capacitance under test and a reference capacitance. The capacitance sensing circuit includes a first sensing channel, a second sensing channel, and a difference comparing unit. During a first period of the sensing period, the first sensing channel senses the capacitance under test, and the second sensing channel senses the reference capacitance. During a second period of the sensing period, the first sensing channel senses the reference capacitance, and the second sensing channel senses the capacitance under test. The difference comparing unit outputs a difference according to the capacitance under test and the reference capacitance. Additionally, a capacitance sensing method is also provided.

18 Claims, 7 Drawing Sheets

TOUCH SENSING SYSTEM, CAPACITANCE SENSING CIRCUIT, AND CAPACITANCE SENSING METHOD

CROSS-REFERENCE TO RELATED APPLICATION

This application claims the priority benefit of Taiwan application serial no. 99103359, filed on Feb. 4, 2010. The entirety the above-mentioned patent application is hereby incorporated by reference herein and made a part of specification.

BACKGROUND OF THE INVENTION

1. Field of the Invention

The invention generally relates to a sensing circuit and a sensing method thereof, and more particularly, to a capacitance sensing circuit and a capacitance sensing method thereof.

2. Description of Related Art

In this information era, reliance on electronic products is increasing day by day. The electronic products including notebook computers, mobile phones, personal digital assistants (PDAs), digital walkmans, and so on are indispensable in our daily lives. Each of the aforesaid electronic products has an input interface for a user to input his or her command, such that an internal system of each of the electronic product spontaneously runs the command. At this current stage, the most common input interface includes a keyboard and a mouse.

From the user's aspect, it is sometimes rather inconvenient to use the conventional input interface including the keyboard and the mouse. Manufacturers aiming to resolve said issue thus start to equip the electronic products with touch input interfaces, e.g. touch pads or touch panels, so as to replace the conditional keyboards and mice. At present, the users' commands are frequently given to the electronic products by physical contact or sensing relationship between users' fingers or styluses and the touch input interfaces. For instance, a capacitive touch input interface characterized by a multi-touch sensing function is more user-friendly than the conventional input interface and thus gradually becomes more and more popular.

However, given that the capacitive touch input interface is applied to a one-end sensing circuit, capacitance of a capacitor under test is required to be measured and stored as a base line capacitance before touch sensing. The base line capacitance is subtracted from the capacitance under test which is measured by the one-end sensing circuit, and thereby the capacitance variations of the capacitor under test can be obtained. Meanwhile, a reference capacitance of the capacitor under test measured by the one-end sensing circuit has a fixed value so that external noises cannot be effectively reduced and accordingly the noise-to-signal ratio (NSR) of the one-end sensing circuit cannot be effectively enhanced.

SUMMARY OF THE INVENTION

Accordingly, the invention is directed to a capacitance sensing circuit of which the noise-to-signal ratio (NSR) can be effectively enhanced, and device and wiring asymmetry in the capacitance sensing circuit is overcome through capacitor alternation.

The invention is directed to a touch sensing system in which the NSR of a capacitance sensing circuit can be effectively enhanced, and device and wiring asymmetry in the capacitance sensing circuit is overcome through capacitor alternation.

The invention is directed to a capacitance sensing method. By using the capacitance sensing method, the NSR of a capacitance sensing circuit can be effectively enhanced, and device and wiring asymmetry in the capacitance sensing circuit is overcome through capacitor alternation.

The invention provides a capacitance sensing circuit including a first sensing channel, a second sensing channel, and a difference comparing unit. The first sensing channel senses a capacitance under test or a reference capacitance. The second sensing channel senses the capacitance under test or the reference capacitance. During at least one first period of a sensing period, the first sensing channel senses the capacitance under test and the second sensing channel senses the reference capacitance. During at least one second period of the sensing period, the first sensing channel senses the reference capacitance and the second sensing channel senses the capacitance under test. The difference comparing unit has a first input terminal and a second input terminal. The first input terminal receives an output of the first sensing channel. The second input terminal receives an output of the second sensing channel. The difference comparing unit outputs a first difference according to the capacitance under test and the reference capacitance.

The invention provides a touch sensing system including a touch input interface and a capacitance sensing circuit. The touch input interface includes a plurality of sensing capacitors for outputting at least one capacitance under test and at least one reference capacitance. The capacitance sensing circuit includes a first sensing channel, a second sensing channel, and a difference comparing unit. The first sensing channel senses the capacitance under test or the reference capacitance. The second sensing channel senses the capacitance under test or the reference capacitance. During at least one first period of a sensing period, the first sensing channel senses the capacitance under test and the second sensing channel senses the reference capacitance. During at least one second period of the sensing period, the first sensing channel senses the reference capacitance and the second sensing channel senses the capacitance under test. The difference comparing unit has a first input terminal and a second input terminal. The first input terminal receives an output of the first sensing channel. The second input terminal receives an output of the second sensing channel. The difference comparing unit outputs a first difference according to the capacitance under test and the reference capacitance.

According to an embodiment of the invention, the first sensing channel includes a first charge-to-voltage converting unit for converting the capacitance under test into a voltage under test or the reference capacitance into a reference voltage. The second sensing channel includes a second charge-to-voltage converting unit for converting the capacitance under test into the voltage under test or the reference capacitance into the reference voltage. During the first period, the first charge-to-voltage converting unit converts the capacitance under test into the voltage under test and the second charge-to-voltage converting unit converts the reference capacitance into the reference voltage. During the second period, the first charge-to-voltage converting unit converts the reference capacitance into the reference voltage, and the second charge-to-voltage converting unit converts the capacitance under test into the voltage under test. The difference comparing unit outputs the first difference according to the voltage under test and the reference voltage.

According to an embodiment of the invention, the first input terminal of the difference comparing unit receives the voltage under test, and the second input terminal of the difference comparing unit receives the reference voltage.

According to an embodiment of the invention, the capacitance sensing circuit further includes a swap unit. The swap unit switches the first sensing channel to sense the capacitance under test or the reference capacitance and switches the second sensing channel to sense the capacitance under test or the reference capacitance.

According to an embodiment of the invention, the swap unit includes a first switch unit and a second switch unit. During the first period, the first switch unit controls the first sensing channel to receive the capacitance under test and controls the second sensing channel to receive the reference capacitance. During the second period, the first switch unit controls the first sensing channel to receive the reference capacitance and controls the second sensing channel to receive the capacitance under test. During the first period, the second switch unit transmits the output of the first sensing channel to the first input terminal and transmits the output of the second sensing channel to the second input terminal. During the second period, the second switch unit transmits the output of the first sensing channel to the second input terminal and transmits the output of the second sensing channel to the first input terminal.

According to an embodiment of the invention, the first periods and the second periods of the sensing period are alternately arranged.

According to an embodiment of the invention, the output of the first sensing channel and the output of the second sensing channel form a second difference during each of the first periods and each of the second periods, and the difference comparing unit integrates and amplifies the second differences to output the first difference.

According to an embodiment of the invention, the difference comparing unit comprises a differential amplifier, a comparator, or an integrator.

The invention provides a capacitance sensing method including following steps. During at least one first period of a sensing period, a capacitance under test is sensed through a first sensing channel, and a reference capacitance is sensed through a second sensing channel. During at least one second period of the sensing period, the reference capacitance is sensed through the first sensing channel, and the capacitance under test is sensed through the second sensing channel. A first difference is generated according to the capacitance under test and the reference capacitance.

According to an embodiment of the invention, the first sensing channel includes a first charge-to-voltage converting unit, and the second sensing channel includes a second charge-to-voltage converting unit. The capacitance sensing method further includes following steps. During the first period, the capacitance under test is converted into a voltage under test by the first charge-to-voltage converting unit, and the reference capacitance is converted into a reference voltage by the second charge-to-voltage converting unit. During the second period, the reference capacitance is converted into the reference voltage by the first charge-to-voltage converting unit, and the capacitance under test is converted into the voltage under test by the second charge-to-voltage converting unit. In the step of generating the first difference, the voltage under test and the reference voltage are compared to generate the first difference.

According to an embodiment of the invention, the output of the first sensing channel and the output of the second sensing channel form a second difference during each of the first periods and each of the second periods. In the step of generating the first difference, the second differences are integrated and amplified to output the first difference.

As described above, in the embodiments of the invention, the capacitance sensing circuit adopts a reference signal as a reference for measuring the signal under test such that external noises are reduced and accordingly the NSR of the capacitance sensing circuit is effectively enhanced. In addition, during different periods of the sensing period, the capacitance sensing circuit senses the capacitance under test and the reference capacitance through different sensing channels so that device and wiring asymmetry in the capacitance sensing circuit is overcome.

It is to be understood that both the foregoing general descriptions and the following detailed embodiments are exemplary and are, together with the accompanying drawings, intended to provide further explanation of technical features and advantages of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

In a capacitive touch input interface, capacitance of a sensing capacitor is determined on whether a position of the sensing capacitor correspondingly on the touch input interface is touched. When the position of the sensing capacitor correspondingly on the touch input interface is touched, capacitance variation is induced by the touch object accordingly, such that a capacitance under test is generated by the touch object and the sensing capacitor.

According to the embodiments of the invention, except for the aforesaid capacitance under test, other capacitances of sensing capacitors can serve as reference values for measuring the capacitance under test. Hence, after the capacitance under test and the reference capacitance are compared, the touch position of the touch object correspondingly on the touch input interface can be determined.

In the embodiments provided hereinafter, a touch panel exemplarily acts as the touch input interface, while people having ordinary skill in the art are aware that the touch panel does not pose a limitation on the touch input interface of the invention. Meanwhile, the invention is not limited to the touch input interface. Any input interface capable of sensing capacitance variations does not depart from the protection scope of the invention.

Figure 1:
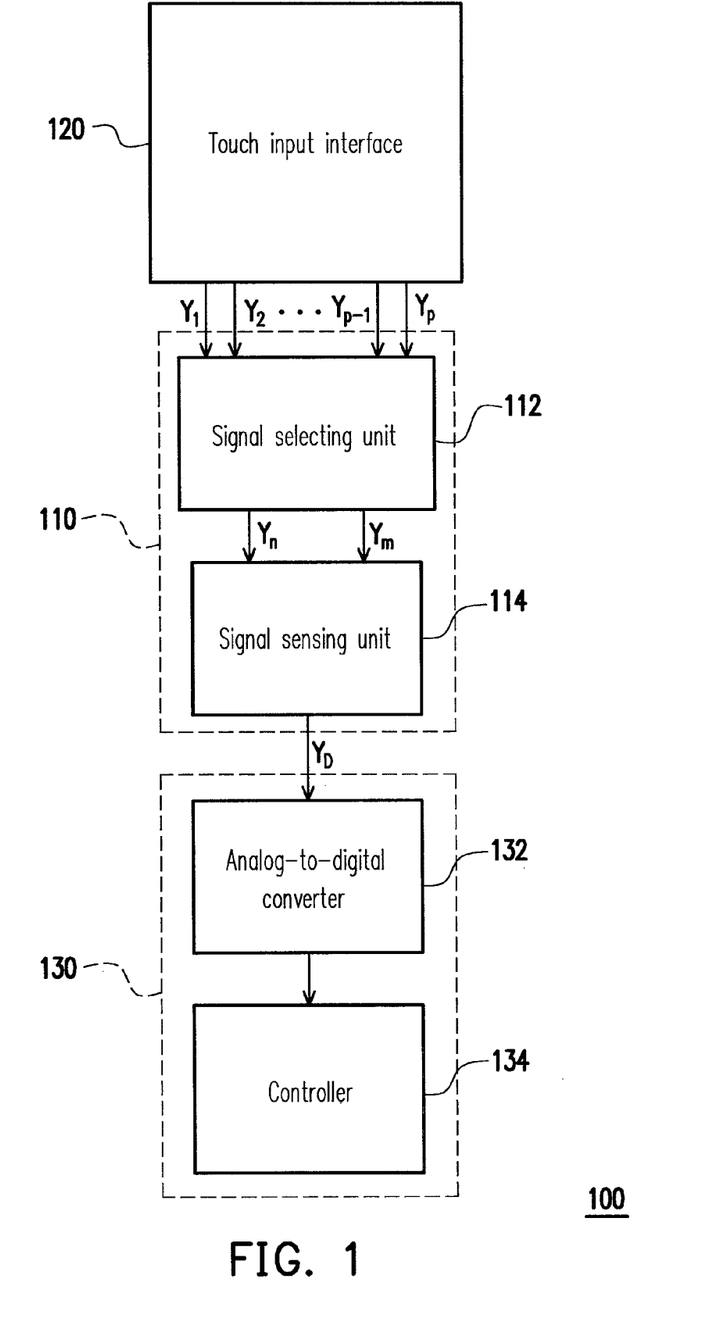
FIG. 1 is a block diagram of a touch sensing system according to an embodiment of the invention.

FIG. 1 is a block diagram of a touch sensing system according to an embodiment of the invention. Referring to FIG. 1, in the present embodiment, the touch sensing system 100 includes a capacitance sensing apparatus 110, a touch input interface 120, and a control unit 130. The touch input interface 120 may be a touch panel of a display or any touch pad with a touch sensing function. The touch input interface 120 includes a plurality of sensing capacitors for outputting a plurality of signal under tests $Y_1$-$Y_p$.

Figure 2:
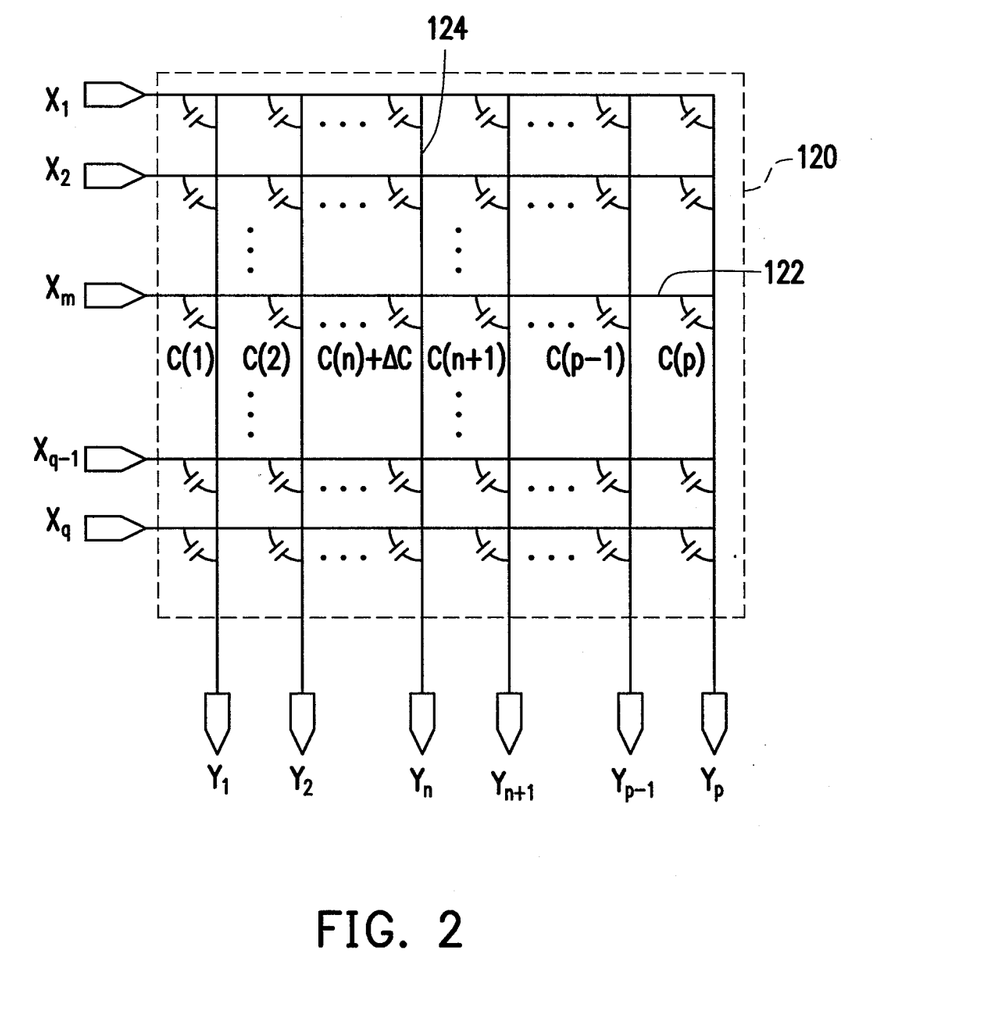
FIG. 2 is a circuit diagram of the touch input interface shown in FIG. 1.

FIG. 2 is a circuit diagram of the touch input interface 120 shown in FIG. 1. Referring to both FIG. 1 and FIG. 2, in the present embod touch object iment, the capacitances of the sensing capacitors are determined according to whether the corresponding positions of the sensing capacitors on the touch input interface 120 are touched. Taking the sensing capacitor C(n) as an example, when the corresponding position of the sensing capacitor C(n) on the touch input interface is touched, the touch object produces a corresponding capacitance variation $\Delta C$. Then, a capacitance under test $C(n)+\Delta C$ is formed by the sensing capacitor C(n) and the capacitance variation $\Delta C$, and a signal under test $Y_n$ is output through a corresponding sensing line 124. Next, the capacitance sensing apparatus 110 senses the variation of the capacitance under test $C(n)+\Delta C$. After that, the control unit 130 determines the corresponding position of the capacitance under test on the touch input interface 120 according to the variation. Namely, the control unit 130 determines the touch position on the touch input interface 120 according to the variation.

It should be noted that in the present embodiment, besides the capacitance under test $C(n)+\Delta C$, the capacitances of other sensing capacitors can be served as reference signals for measuring the capacitance under test, so that external noises are reduced and the noise-to-signal ratio (NSR) of the capacitance sensing apparatus 110 is enhanced.

To be specific, taking a mutual capacitance touch sensing system as an example, when the system is in operation, the sensing capacitances on the touch input interface 120 receives driving signals $X_1$-$X_q$ from a driving unit (not shown) through a corresponding driving line and generates the sensing signals $Y_1$-$Y_p$ on the corresponding sensing line, wherein p and q are respectively a positive integer, 1<p, and 1<q. For example, while driving, the driving signal $X_m$ supplied to the driving line 122 is transmitted to the sensing line 124 crossing the driving line 122 through the sensing capacitor C(n) so that a signal under test $Y_n$ is generated on the sensing line 124, wherein n and m are respectively a positive integer, and $1 \leq n \leq p$, and $1 \leq m \leq q$.

Thus, when the system is in operation, the capacitance sensing apparatus 110 can obtain a capacitance distribution of the sensing capacitors C(1)-C(p) by supplying the driving signal $X_m$ to the driving line 122.

Thereby, when the touch object (for example, a finger or a stylus) approaches or touches the corresponding position of the sensing capacitor C(n) on the touch input interface 120, a corresponding capacitance variation $\Delta C$ is produced, and accordingly the capacitance distribution is changed. Thereafter, the touch sensing system 100 determines the corresponding position of the capacitance under test $C(n)+\Delta C$ on the touch input interface 120 through the capacitance sensing apparatus 110 and the control unit 130.

In the present embodiment, the capacitance sensing apparatus 110 includes a signal selecting unit 112 and a signal sensing unit 114. The control unit 130 includes an analog-to-digital converter (ADC) 132 and a controller 134.

The signal selecting unit 112 receives the sensing signals $Y_1$-$Y_p$ and selects at least one signal under test and at least one reference signal from the sensing signals $Y_1$-$Y_p$. Next, the signal selecting unit 112 transmits the signal under test and reference signal which are selected to the signal sensing unit 114 to perform a difference comparison.

For example, during a sensing period, the signal selecting unit 112 selects and transmits the sensing signals $Y_n$ and $Y_m$ to the signal sensing unit 114 to perform the difference comparison, wherein m is a positive integer, $1 \leq m \leq p$, and $m \neq n$. Namely, the signal selecting unit 112 selects the sensing signal $Y_m$ as the reference signal for measuring the capacitance under test and outputs the sensing signal $Y_m$ to the signal sensing unit 114 to be compared with the sensing signal $Y_n$. After the signal sensing unit 114 finishes the comparison, it generates a difference signal $Y_D$ and outputs the difference signal $Y_D$ to the control unit 130. The control unit 130 determines the touch position on the touch input interface 120 according to the difference signal $Y_D$.

Thus, in the present embodiment, the signal selecting unit 112 selects the sensing signal $Y_m$ from the rest sensing signals (excluding the sensing signal $Y_n$) as the reference signal for measuring the capacitance under test, i.e. the sensing signal $Y_n$, so that noises from the touch input interface 120 can be effectively reduced and the NSR of the sensing system can be enhanced.

In other words, noises from the touch input interface 120 can be considered as common mode noises. Thus, by selecting at least one sensing signal from the unselected sensing signals as the reference signal for measuring the capacitance under test, common mode noises in the sensing circuit can be reduced and the NSR of the sensing system can be enhanced.

In the present embodiment, the signal sensing unit 114 may be a comparator (not shown) that receives and compares the signal under test and the reference signal received from the signal selecting unit 112 to generate a corresponding difference signal for the control unit 130. However, the invention is not limited thereto. In another embodiment, the signal sensing unit 114 may be a differential amplifier. In this case, the differential amplifier compares and amplifies the voltage difference between the signal under test and the reference signal and outputs the amplified voltage difference to the control unit 130 to detect the touch position precisely. In yet another embodiment, the signal sensing unit 114 may also be an integrator. In this case, the integrator integrates and amplifies the voltage difference between the signal under test and the reference signal to output a corresponding difference signal $Y_D$ to the control unit 130.

In the present embodiment, the difference signal $Y_D$ generated by the signal sensing unit 114 may be an analog signal. Thus, after receiving the analog signal, the ADC 132 converts it into a digital signal. After that, the controller 134 performs a digital operation on the digital signal to obtain the touch position corresponding to the capacitance under test $C(n)+\Delta C$ on the touch input interface 120. Namely, the controller 134 can determine the touch position on the touch input interface 120 according to the difference signal $Y_D$.

It should be noted that even though the touch sensing system 100 is described as a mutual capacitance touch system in the present embodiment, the invention is not limited thereto. In other embodiments, the touch sensing system 100 may also be a self capacitance touch system or any other type of touch system.

Additionally, in the present embodiment, the signal selecting unit 112 selects one sensing signal among the unselected sensing signals as a reference signal for measuring the capacitance under test. In another embodiment, the signal selecting unit 112 may also selects two sensing signals among the unselected signal under tests as reference signals for measuring the capacitance under test.

Figure 3:
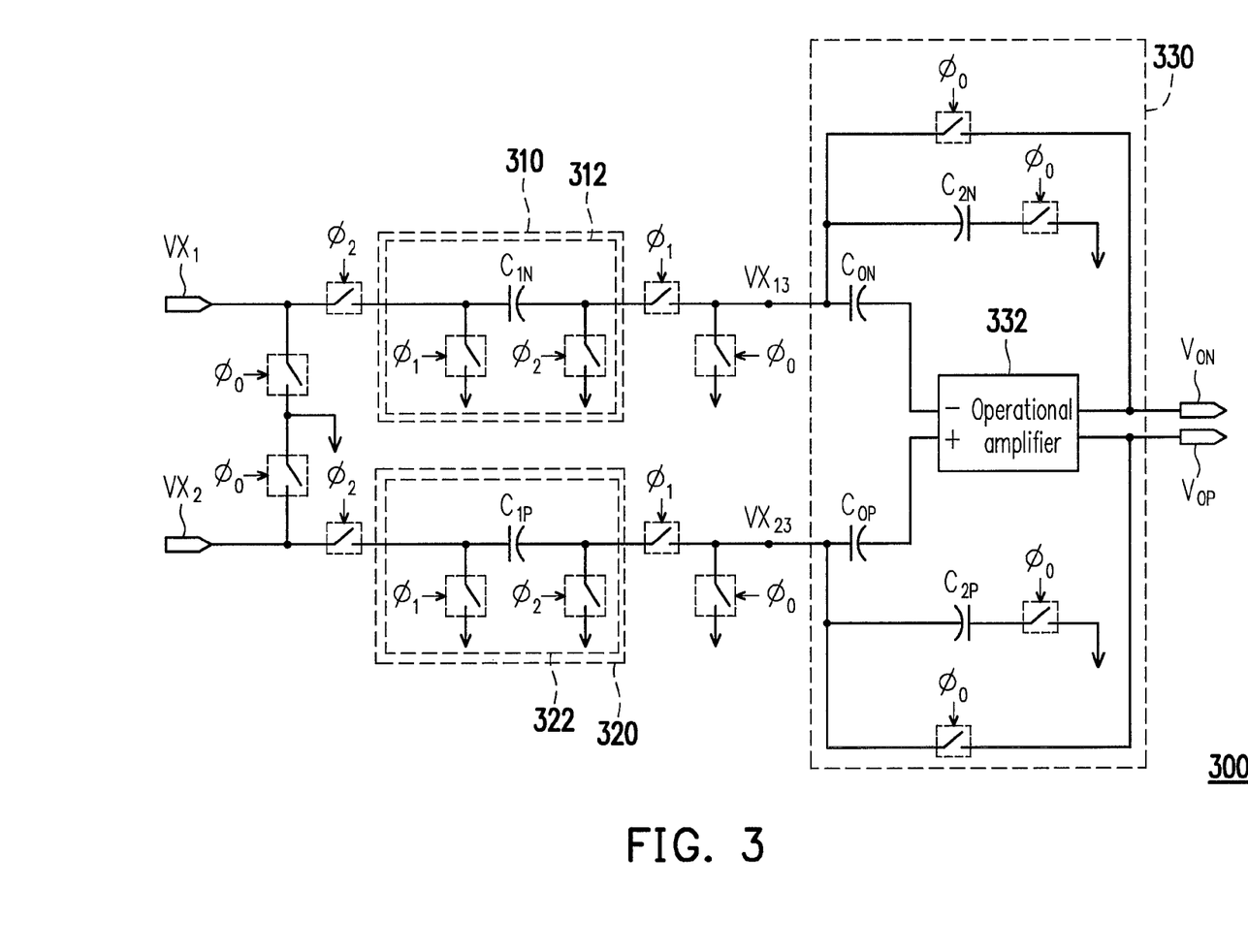
FIG. 3 is a schematic diagram of a capacitance sensing circuit according to an embodiment of the invention.

FIG. 3 is a schematic diagram of a capacitance sensing circuit according to an embodiment of the invention. Referring to FIG. 3, in the present embodiment, a signal sensing unit, for example, includes the capacitance sensing circuit in FIG. 3, which senses voltages or capacitances corresponding to the signal under test and the reference signal.

In the present embodiment, the capacitance sensing circuit 300 includes a first sensing channel 310, a second sensing channel 320, and a difference comparing unit 330. The first sensing channel 310 senses the signal under test (for example, the signal under test $Y_n$ in FIG. 1) corresponding to the capacitance under test. The second sensing channel 320 senses the reference signal (for example, the reference signal $Y_m$ in FIG. 1) corresponding to the reference capacitance. The difference comparing unit 330 has a first input terminal $VX_{13}$ and a second input terminal $VX_{23}$. The first input terminal $VX_{13}$ receives an output of the first sensing channel 310, and the second input terminal $VX_{23}$ receives an output of the second sensing channel 320. The difference comparing unit 330 outputs a difference signal $Y_D$ according to the capacitance under test and the reference capacitance.

Figure 4:
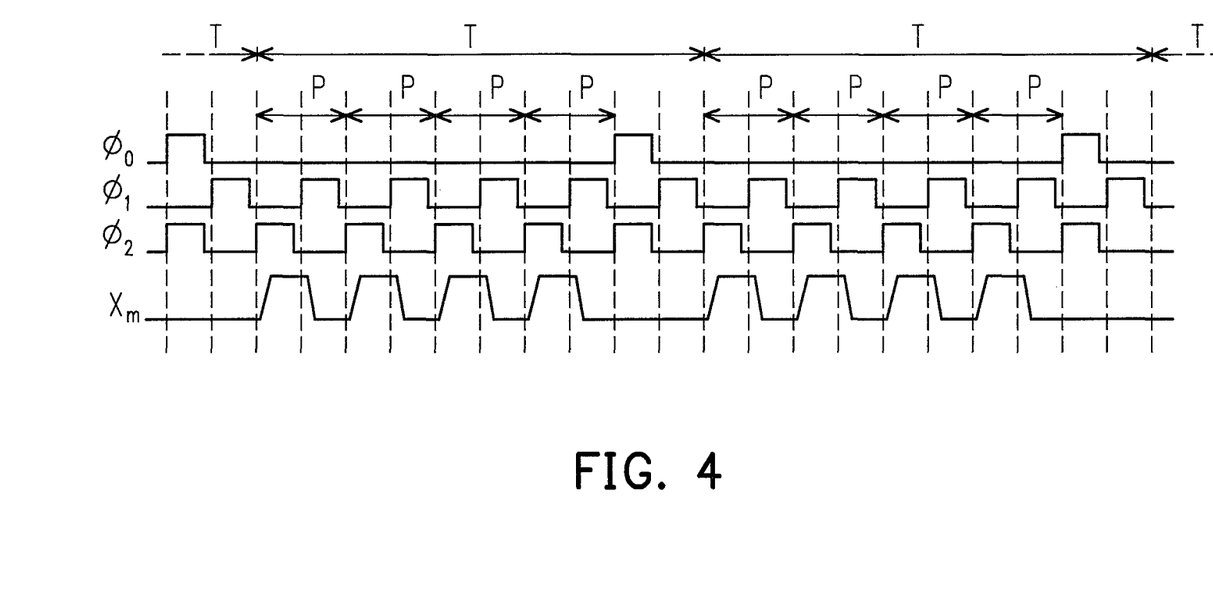
FIG. 4 is a timing diagram of a control signal of the capacitance sensing circuit.

FIG. 4 is a timing diagram of control signals of the capacitance sensing circuit. Referring to FIG. 1, FIG. 3, and FIG. 4, in the present embodiment, the first sensing channel 310 includes a first charge-to-voltage converting unit 312, the second sensing channel 320 includes a second charge-to-voltage converting unit 322, and the difference comparing unit 330 includes an operational amplifier 332. Herein the difference comparing unit 330 is implemented with an integrator. However, the invention is not limited thereto.

Taking the first sensing channel 310 as an example, during each period P of a sensing period T, a driving signal $X_m$ is supplied to the driving line 122 and transmitted to the sensing line 124 crossing the driving line 122 through the capacitance under test $C(n)+\Delta C$, so that a signal under test $Y_n$ is generated. Then, the first sensing channel 310 receives the signal under test $Y_n$ through a pad $VX_1$ to sense the signal under test $Y_n$ corresponding to the capacitance under test.

During the first period P, the charges corresponding to the capacitance under test are stored in a storage capacitor $C_{1N}$ when the timing signal $\psi_2$ is at a high level. When the timing signal $\psi_1$ is at the high level, the charges stored in the storage capacitor $C_{1N}$ are transmitted to the difference comparing unit 330 through the first input terminal $VX_{13}$ and stored in an integrated capacitor $C_{2N}$. Namely, through the storage capacitor $C_{1N}$, the first charge-to-voltage converting unit 312 can convert the charges it receives into a voltage under test and transmits the voltage under test to the difference comparing unit 330.

Meanwhile, the second sensing channel 320 receives the reference signal $Y_m$ through the pad $VX_2$ to sense the reference signal $Y_m$ corresponding to the reference capacitance. Then, the second charge-to-voltage converting unit 322 converts the charges it receives into a reference voltage and transmits the reference voltage to the difference comparing unit 330.

Through the operational amplifier 332 and the integrated capacitors $C_{2N}$ and $C_{2P}$, the difference comparing unit 330 integrates and amplifies the voltage difference between the signal under test and the reference signal, wherein the gains are respectively $C_{1N}/C_{2N}$ and $C_{1P}/C_{2P}$. Herein it is assumed that $C_{1N}=C_{1P}$ and $C_{2N}=C_{2P}$. However, the invention is not limited thereto.

In the present embodiment, the sensing period T contains four periods P. The difference comparing unit 330 integrates and amplifies the voltage difference between the signal under test and the reference signal during each period P. Thus, when the timing signal $\psi_0$ is at the high level, the voltage difference integrated and amplified during each period P is stored into the capacitors $C_{ON}$ and $C_{OP}$, and the corresponding difference signal $Y_D$ is output from the pads $V_{ON}$ and $V_{OP}$. Thereby, the difference comparing unit 330 outputs the difference signal $Y_D$ corresponding to the voltage difference according to the voltage under test and the reference voltage.

The present embodiment is described with the sensing period T containing four periods P. However, the invention is not limited thereto, and in another embodiment, the sensing period T may contain only one period P.

It should be noted that in the present embodiment, two sensing channels respectively sensing the capacitance under test and the reference capacitance are described as an example. However, in other embodiments, the capacitance sensing circuit may also include three or more sensing channels, wherein one of the sensing channels senses the capacitance under test, and other sensing channels sense the reference capacitances. Namely, the signal selecting unit selects two sensing signals among the unselected sensing signals as reference signals for measuring the capacitance under test.

Additionally, the difference comparing unit 330 is implemented with an integrator in the present embodiment. However, the invention is not limited thereto, and in another embodiment, the difference comparing unit 330 may also be implemented with a differential amplifier or a comparator.

Figure 5:
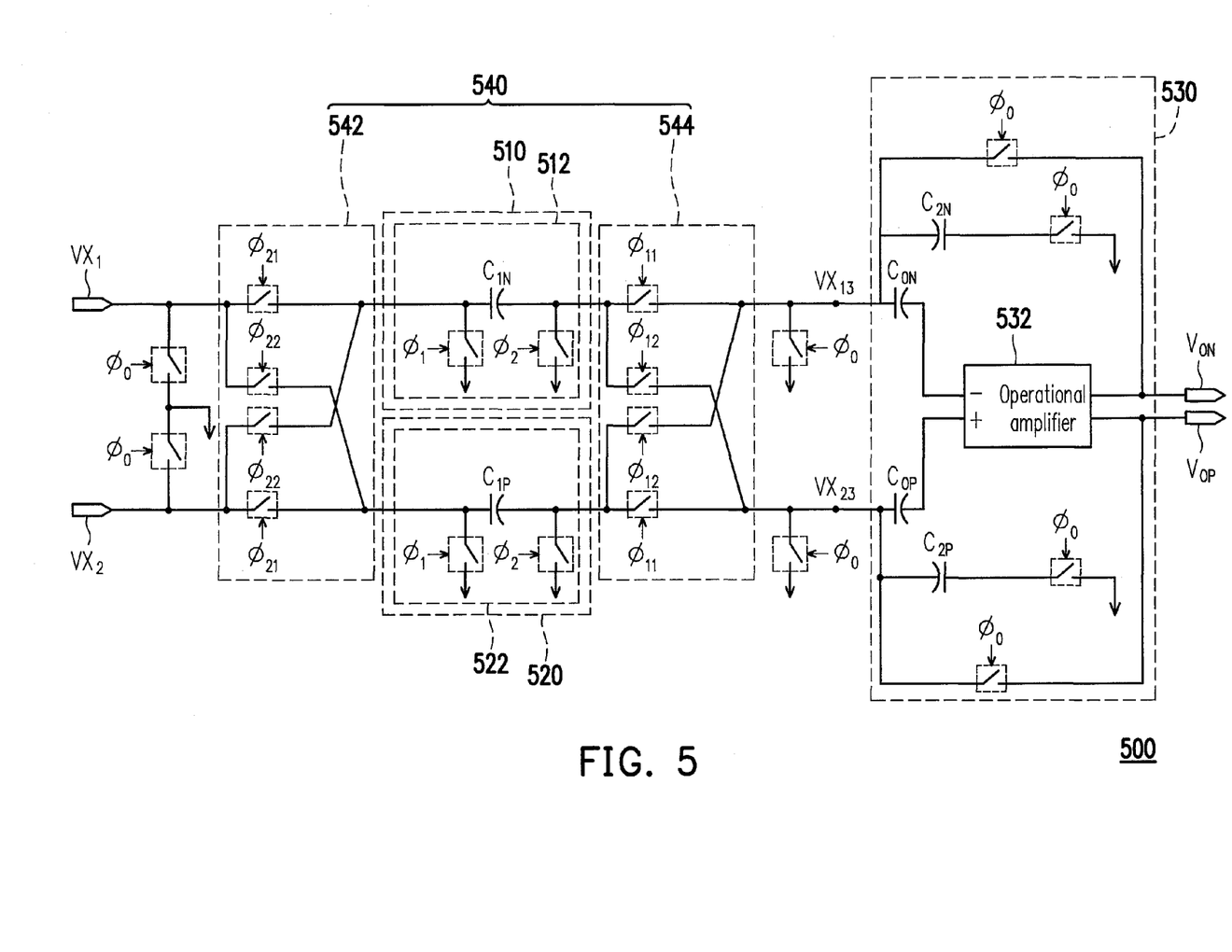
FIG. 5 is a schematic diagram of a capacitance sensing circuit according to another embodiment of the invention.
Figure 6:
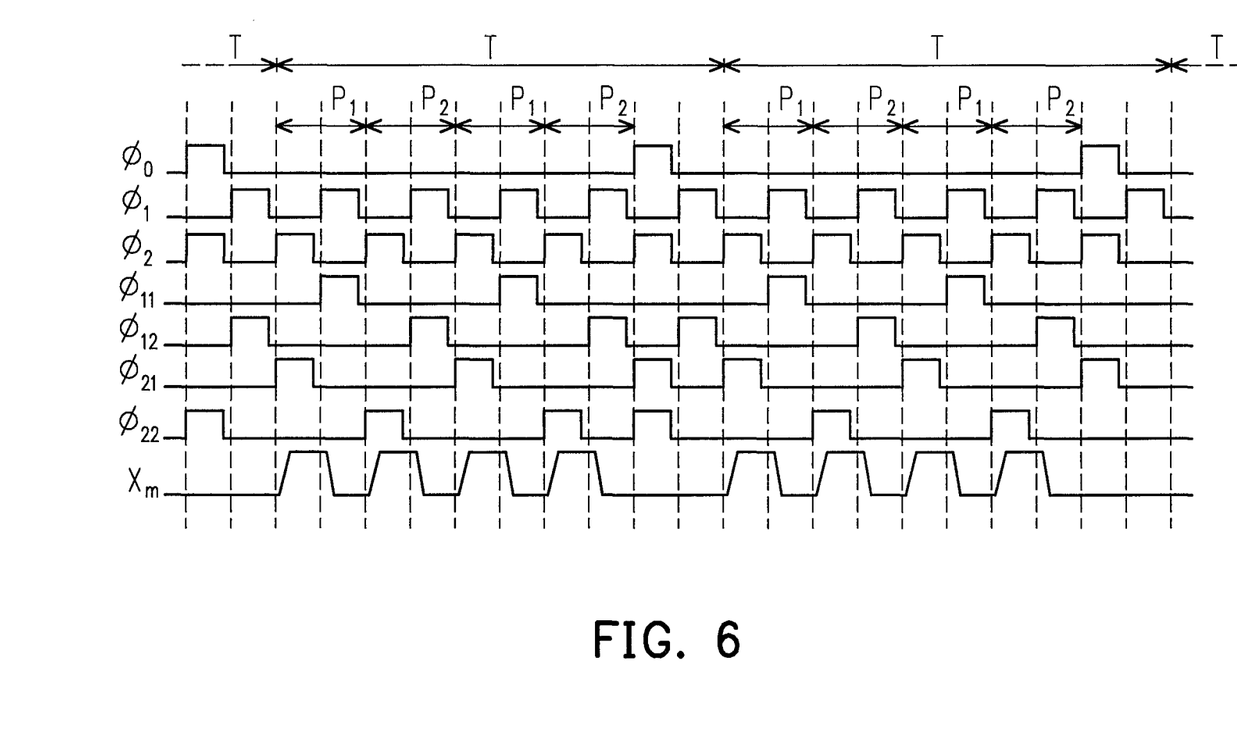
FIG. 6 is a timing diagram of a control signal of the capacitance sensing circuit.

FIG. 5 is a schematic diagram of a capacitance sensing circuit according to another embodiment of the invention. FIG. 6 is a timing diagram of control signals of the capacitance sensing circuit. Referring to FIG. 5 and FIG. 6, in the present embodiment, the capacitance sensing circuit 500 includes a first sensing channel 510, a second sensing channel 520, a difference comparing unit 530, and a swap unit 540. The first sensing channel 510 senses a capacitance under test or a reference capacitance, and the second sensing channel 520 senses the capacitance under test or the reference capacitance.

It should be noted that in the present embodiment, during a first period $P_1$ of the sensing period T, the first sensing channel 510 senses the capacitance under test and the second sensing channel 520 senses the reference capacitance, and during a second period $P_2$ of the sensing period T, the first sensing channel 510 senses the reference capacitance and the second sensing channel 520 senses the capacitance under test. The swap unit 540 switches the first sensing channel 510 to sense the capacitance under test or the reference capacitance and switches the second sensing channel 520 to sense the capacitance under test or the reference capacitance.

To be specific, the swap unit 540 includes a first switch unit 542 and a second switch unit 544. The first switch unit 542 controls the first sensing channel 510 to receive the capacitance under test and controls the second sensing channel 520 to receive the reference capacitance during the first period $P_1$, and the first switch unit 542 controls the first sensing channel 510 to receive the reference capacitance and controls the second sensing channel 520 to receive the capacitance under test during the second period $P_2$. The second switch unit 544 transmits the output of the first sensing channel 510 to the input terminal $VX_{13}$ of the difference comparing unit 530 and transmits the output of the second sensing channel 520 to the input terminal $VX_{23}$ of the difference comparing unit 530 during the first period $P_1$, and the second switch unit 544 transmits the output of the first sensing channel 510 to the input terminal $VX_{23}$ of the difference comparing unit 530 and transmits the output of the second sensing channel 520 to the input terminal $VX_{13}$ of the difference comparing unit 530 during the second period $P_2$.

Taking the sensing channel 510 as an example, the sensing channel 510 includes a charge-to-voltage converting unit 512. During each period $P_1$ of the sensing period T, the sensing channel 510 receives the signal under test $Y_n$ through the pad $VX_1$ to sense the signal under test $Y_n$ corresponding to the capacitance under test.

During the period $P_1$, when the timing signal $\psi_2$ is at a high level, the timing signal $\psi_{21}$ is also at a high level so that the charges corresponding to the capacitance under test are stored in a storage capacitor $C_{1N}$. Subsequently, when the timing signal $\psi_1$ is at a high level, the timing signal $\psi_{11}$ is also at a high level so that the charges stored in the storage capacitor $C_{1N}$ are transmitted to the difference comparing unit 530 through the input terminal $VX_{13}$ and stored in the integrated capacitor $C_{2N}$.

On the other hand, the second sensing channel 520 includes a charge-to-voltage converting unit 522. During each period $P_1$ of the sensing period T, the second sensing channel 520 receives the reference signal $Y_m$ through the pad $VX_2$ to sense the reference signal $Y_m$ corresponding to the reference capacitance.

During the period $P_1$, the charges corresponding to the reference capacitance are stored in a storage capacitor $C_{1P}$ when the timing signals $\psi_2$ and $\psi_{21}$ are at a high level. Subsequently, when the timing signals $\psi_1$ and $\psi_{11}$ are at a high level, the charges stored in the storage capacitor $C_{1P}$ are transmitted to the difference comparing unit 530 through the input terminal $VX_{23}$ and stored in the integrated capacitor $C_{2P}$.

Thus, through the operational amplifier 532 and the integrated capacitors $C_{2N}$ and $C_{2P}$, the difference comparing unit 530 integrates and simplifies the voltage difference between the signal under test and the reference signal, wherein the gains are respectively $C_{1N}/C_{2N}$ and $C_{1P}/C_{2P}$. Herein it is assumed that $C_{1N}=C_{1P}$ and $C_{2N}=C_{2P}$. However, the invention is not limited thereto.

Thereafter, during the period $P_2$, the timing signal $\psi_{22}$ is also at a high level when the timing signal $\psi_2$ is at a high level. It should be noted that the charges corresponding to the capacitance under test are stored in the storage capacitor $C_{1P}$ of the second sensing channel 520 at this time. Subsequently, when the timing signal $\psi_1$ is at a high level, the timing signal $\psi_{12}$ is also at a high level so that the charges stored in the storage capacitor $C_{1P}$ are transmitted to the difference comparing unit 530 through the input terminal $VX_{13}$ and stored in the integrated capacitor $C_{2N}$.

On the other hand, regarding the reference capacitance, during the period $P_2$, the charges corresponding to the reference capacitance are stored in the storage capacitor $C_{1N}$ of the first sensing channel 510 when the timing signals $\psi_2$ and $\psi_{22}$ are at a high level. Subsequently, when the timing signals $\psi_1$ and $\psi_{12}$ are at a high level, the charges stored in the storage capacitor $C_{1N}$ are transmitted to the difference comparing unit 530 through the input terminal $VX_{23}$ and stored in the integrated capacitor $C_{2P}$.

Namely, in the present embodiment, the first switch unit 542 controls the first sensing channel 510 to receive the capacitance under test and controls the second sensing channel 520 to receive the reference capacitance during the first period $P_1$. Contrarily, the first switch unit 542 controls the first sensing channel 510 to receive the reference capacitance and controls the second sensing channel 520 to receive the capacitance under test during the second period $P_2$.

It should be noted that in the present embodiment, the second switch unit 544 transmits the output of the first sensing channel 510 to the input terminal $VX_{13}$ of the difference comparing unit 530 and transmits the output of the second sensing channel 520 to the input terminal $VX_{23}$ of the difference comparing unit 530 during the first period $P_1$, and the second switch unit 544 transmits the output of the first sensing channel 510 to the input terminal $VX_{23}$ of the difference comparing unit 530 and transmits the output of the second sensing channel 520 to the input terminal $VX_{13}$ of the difference comparing unit 530 during the second period $P_2$. Namely, the input terminal $VX_{13}$ of the difference comparing unit 530 always receives the voltage under test while the input terminal $VX_{23}$ thereof always receives the reference voltage regardless of whether it is during the first period $P_1$ or the second period $P_2$.

Thereafter, through the operational amplifier 532 and the integrated capacitors $C_{2N}$ and $C_{2P}$, the difference comparing unit 530 integrates and amplifies the voltage difference between the signal under test and the reference signal, wherein the gains are respectively $C_{1N}/C_{2N}$ and $C_{1P}/C_{2P}$. Herein it is assumed that $C_{1N}=C_{1P}$ and $C_{2N}=C_{2P}$. However, the invention is not limited herein.

During each period of the sensing period T, the difference comparing unit 530 integrates and amplifies the voltage difference between the signal under test and the reference signal. Thus, when the timing signal $\psi_0$ is at a high level, the voltage difference integrated and amplified during each period P is stored into the capacitors $C_{0N}$ and $C_{0P}$, and the corresponding difference signal is output from the pads $V_{ON}$ and $V_{OP}$. Thus, the difference comparing unit 530 can output a difference signal $Y_D$ corresponding to the voltage difference according to the voltage under test and the reference voltage.

In the present embodiment, because the sensing period T contains a plurality of periods $P_1$ and $P_2$ which are alternately arranged, the capacitance sensing circuit 500 senses the capacitance under test and the reference capacitance through different sensing channels during each period of the sensing period T, so that the device and wiring asymmetry in the capacitance sensing circuit 500 is overcome.

The present embodiment is described by taking a sensing period T containing a plurality of periods $P_1$ and $P_2$ which are alternately arranged as an example. However, the invention is not limited thereto, and in another embodiment, the sensing period T may also contain only one period $P_1$ and one period $P_2$.

Figure 7:
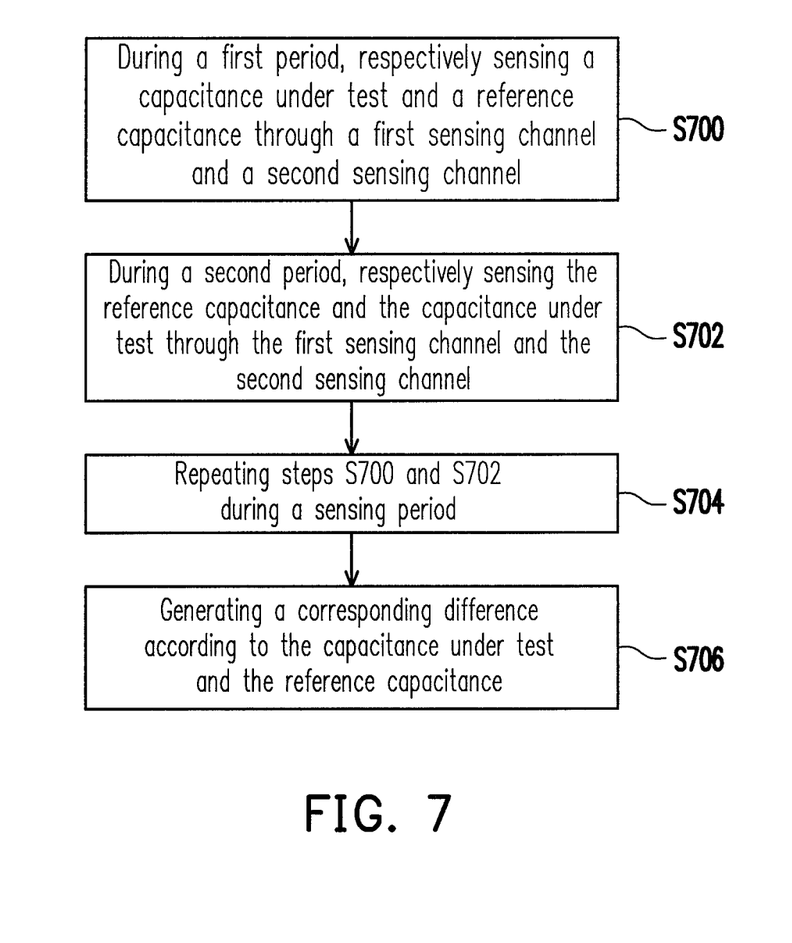
FIG. 7 is a flowchart of a capacitance sensing method according to an embodiment of the invention.

FIG. 7 is a flowchart of a capacitance sensing method according to an embodiment of the invention. Referring to FIGS. 5-7, the capacitance sensing method in the present embodiment includes following steps. First, in step S700, during a first period $P_1$, a capacitance under test and a reference capacitance are respectively sensed through a first sensing channel 510 and a second sensing channel 520. Then, in step S702, during a second period $P_2$, the reference capacitance and the capacitance under test are respectively sensed through the first sensing channel 510 and the second sensing channel 520. Next, in step S704, steps S700 and S702 are repeated during the sensing period T. Thereafter, in step S706, a corresponding difference is generated according to the capacitance under test and the reference capacitance.

Besides, the capacitance sensing method described in this embodiment of the invention is sufficiently taught, suggested, and embodied in the embodiments illustrated in FIG. 1 to FIG. 6, and therefore no further description is provided herein.

Furthermore, in the embodiments of the invention, even though a touch sensing system is described as an example of object sensing apparatuses, the invention is not limited thereto, and any object sensing apparatus that can sense and determine the touch position of an object is within the scope of the invention.

As described above, in the embodiments of the invention, the capacitance sensing circuit adopts a reference signal as a reference for measuring the signal under test such that external noises are reduced and accordingly the NSR of the capacitance sensing circuit is effectively enhanced. In addition, during different periods of the sensing period, the capacitance sensing circuit senses the capacitance under test and the reference capacitance through different sensing channels so that device and wiring asymmetry in the capacitance sensing circuit is overcome.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A capacitance sensing circuit, comprising:
a first sensing channel sensing a capacitance under test or a reference capacitance;
a second sensing channel sensing the capacitance under test or the reference capacitance; and
a difference comparing unit having a first input terminal and a second input terminal, the first input terminal receiving an output of the first sensing channel, the second input terminal receiving an output of the second sensing channel, and the difference comparing unit outputting a first difference according to the capacitance under test and the reference capacitance,
wherein during at least one first period of a sensing period, the first sensing channel senses the capacitance under test, and the second sensing channel senses the reference capacitance, and during at least one second period of the sensing period, the first sensing channel senses the reference capacitance, and the second sensing channel senses the capacitance under test.

2. The capacitance sensing circuit according to claim 1, wherein
the first sensing channel comprises a first charge-to-voltage converting unit converting the capacitance under test into a voltage under test or converting the reference capacitance into a reference voltage;
the second sensing channel comprises a second charge-to-voltage converting unit converting the capacitance under test into the voltage under test or converting the reference capacitance into the reference voltage; and
the difference comparing unit outputs the first difference according to the voltage under test and the reference voltage,
wherein during the first period, the first charge-to-voltage converting unit converts the capacitance under test into the voltage under test, and the second charge-to-voltage converting unit converts the reference capacitance into the reference voltage, and during the second period, the first charge-to-voltage converting unit converts the reference capacitance into the reference voltage, and the second charge-to-voltage converting unit converts the capacitance under test into the voltage under test.

3. The capacitance sensing circuit according to claim 2, wherein the first input terminal of the difference comparing unit receives the voltage under test, and the second input terminal of the difference comparing unit receives the reference voltage.

4. The capacitance sensing circuit according to claim 1, further comprising:
a swap unit switching the first sensing channel to sense the capacitance under test or the reference capacitance and switching the second sensing channel to sense the capacitance under test or the reference capacitance.

5. The capacitance sensing circuit according to claim 4, wherein the swap unit comprises:
a first switch unit controlling the first sensing channel to receive the capacitance under test and controlling the second sensing channel to receive the reference capacitance during the first period, and the first switch unit controlling the first sensing channel to receive the reference capacitance and the second sensing channel to receive the capacitance under test during the second period; and
a second switch unit transmitting the output of the first sensing channel to the first input terminal and transmitting the output of the second sensing channel to the second input terminal during the first period, and the second switch unit transmitting the output of the first sensing channel to the second input terminal and transmitting the output of the second sensing channel to the first input terminal during the second period.

6. The capacitance sensing circuit according to claim 1, wherein the first periods and the second periods of the sensing period are alternately arranged.

7. The capacitance sensing circuit according to claim 6, wherein the output of the first sensing channel and the output of the second sensing channel form a second difference during each of the first periods and each of the second periods, and the difference comparing unit integrates and amplifies the second differences to output the first difference.

8. The capacitance sensing circuit according to claim 1, wherein the difference comparing unit comprises a differential amplifier, a comparator, or an integrator.

9. A touch sensing system, comprising:
a touch input interface comprising a plurality of sensing capacitors, the sensing capacitors outputting at least one capacitance under test and at least one reference capacitance; and
a capacitance sensing circuit comprising:
a first sensing channel sensing the capacitance under test or the reference capacitance;
a second sensing channel sensing the capacitance under test or the reference capacitance; and
a difference comparing unit, having a first input terminal and a second input terminal, the first input terminal receiving an output of the first sensing channel, the second input terminal receiving an output of the second sensing channel, and the difference comparing unit outputting a first difference according to the capacitance under test and the reference capacitance,
wherein during at least one first period of a sensing period, the first sensing channel senses the capacitance under test, and the second sensing channel senses the reference capacitance, and during at least one second period of the sensing period, the first sensing channel senses the reference capacitance, and the second sensing channel senses the capacitance under test.

10. The touch sensing system according to claim 9, wherein
- the first sensing channel comprises a first charge-to-voltage converting unit converting the capacitance under test into a voltage under test or converting the reference capacitance into a reference voltage;
- the second sensing channel comprises a second charge-to-voltage converting unit converting the capacitance under test into the voltage under test or converting the reference capacitance into the reference voltage; and
- the difference comparing unit outputs the first difference according to the voltage under test and the reference voltage,
- wherein during the first period, the first charge-to-voltage converting unit converts the capacitance under test into the voltage under test, and the second charge-to-voltage converting unit converts the reference capacitance into the reference voltage, and during the second period, the first charge-to-voltage converting unit converts the reference capacitance into the reference voltage, and the second charge-to-voltage converting unit converts the capacitance under test into the voltage under test.

11. The touch sensing system according to claim 10, wherein the first input terminal of the difference comparing unit receives the voltage under test, and the second input terminal of the difference comparing unit receives the reference voltage.

12. The touch sensing system according to claim 9 further comprising:
- a swap unit switching the first sensing channel to sense the capacitance under test or the reference capacitance and switching the second sensing channel to sense the capacitance under test or the reference capacitance.

13. The touch sensing system according to claim 12, wherein the swap unit comprises:
- a first switch unit controlling the first sensing channel to receive the capacitance under test and controlling the second sensing channel to receive the reference capacitance during the first period, and the first switch unit controlling the first sensing channel to receive the reference capacitance and controlling the second sensing channel to receive the capacitance under test during the second period; and
- a second switch unit transmitting the output of the first sensing channel to the first input terminal and transmitting the output of the second sensing channel to the second input terminal during the first period, and the second switch unit transmitting the output of the first sensing channel to the second input terminal and transmitting the output of the second sensing channel to the first input terminal during the second period.

14. The touch sensing system according to claim 9, wherein the first periods and the second periods of the sensing period are alternately arranged.

15. The touch sensing system according to claim 14, wherein the output of the first sensing channel and the output of the second sensing channel form a second difference during each of the first periods and each of the second periods, and the difference comparing unit integrates and amplifies the second differences to output the first difference.

16. The touch sensing system according to claim 9, wherein the difference comparing unit comprises a differential amplifier, a comparator, or an integrator.

17. A touch display comprises the touch sensing system as claimed in claim 9.

18. A portable electronic apparatus comprises the touch sensing system as claimed in claim 9.

* * * * *